United States Patent
Cheng et al.

(10) Patent No.: US 9,721,945 B2
(45) Date of Patent: Aug. 1, 2017

(54) SEMICONDUCTOR DEVICE WITH IGBT AND DIODE

(71) Applicant: DENSO CORPORATION, Kariya, Aichi-pref. (JP)

(72) Inventors: Weitao Cheng, Kariya (JP); Shigeki Takahashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/105,664

(22) PCT Filed: Dec. 16, 2014

(86) PCT No.: PCT/JP2014/006244
§ 371 (c)(1),
(2) Date: Jun. 17, 2016

(87) PCT Pub. No.: WO2015/093038
PCT Pub. Date: Jun. 25, 2015

(65) Prior Publication Data
US 2017/0025410 A1    Jan. 26, 2017

(30) Foreign Application Priority Data

Dec. 20, 2013  (JP) .................................. 2013-264294
Dec. 8, 2014   (JP) .................................. 2014-248139

(51) Int. Cl.
*H01L 29/36* (2006.01)
*H01L 21/22* (2006.01)
(Continued)

(52) U.S. Cl.
CPC ...... *H01L 27/0716* (2013.01); *H01L 27/0727* (2013.01); *H01L 29/0834* (2013.01);
(Continued)

(58) Field of Classification Search
CPC ............. H01L 27/0716; H01L 29/7397; H01L 29/1095; H01L 29/1087; H01L 29/32; H01L 29/861; H01L 29/78; H01L 27/0727
See application file for complete search history.

(56) References Cited

U.S. PATENT DOCUMENTS 8,405,122 B2 *   3/2013  Kouno et al. ....... H01L 29/0619
                                                       257/139
2007/0108468 A1   5/2007  Takahashi
(Continued)

FOREIGN PATENT DOCUMENTS

JP    2008-004866 A    1/2008
JP    2013-008778 A    1/2013
JP    2014-063961 A    4/2014

*Primary Examiner* — Benjamin Sandvik
*Assistant Examiner* — Damon Hillman
(74) *Attorney, Agent, or Firm* — Posz Law Group, PLC

(57) ABSTRACT

A semiconductor device includes: an IGBT section including a vertical IGBT; and a diode section arranged along the IGBT section and including a diode. The diode section includes a hole injection reduction layer having a first conductivity type and arranged in an upper layer portion of a drift layer, extending to a depth deeper than an anode region constituted by a second conductivity type region in the diode section, having an impurity concentration lower than an impurity concentration of the anode region and higher than an impurity concentration of the drift layer.

9 Claims, 13 Drawing Sheets

(51) Int. Cl.
*H01L 27/07* (2006.01)
*H01L 29/78* (2006.01)
*H01L 29/739* (2006.01)
*H01L 29/08* (2006.01)
H01L 29/10 (2006.01)
H01L 29/32 (2006.01)
H01L 29/861 (2006.01)

(52) U.S. Cl.
CPC .......... *H01L 29/7397* (2013.01); *H01L 29/78* (2013.01); *H01L 29/1087* (2013.01); *H01L 29/1095* (2013.01); *H01L 29/32* (2013.01); *H01L 29/861* (2013.01)

(56) References Cited

U.S. PATENT DOCUMENTS

| | | |
|---|---|---|
| 2008/0048295 A1 | 2/2008 | Takahashi |
| 2010/0090248 A1 | 4/2010 | Kouno |
| 2012/0043581 A1* | 2/2012 | Koyama et al. .... H01L 29/0696 257/140 |
| 2012/0132954 A1 | 5/2012 | Kouno et al. |
| 2012/0146091 A1 | 6/2012 | Tanabe et al. |
| 2012/0319163 A1 | 12/2012 | Tsuzuki et al. |

\* cited by examiner

SEMICONDUCTOR DEVICE WITH IGBT AND DIODE

CROSS REFERENCE TO RELATED APPLICATIONS

This application is the U.S. national phase of International Patent Application No. PCT/JP2014/006244 filed on Dec. 16, 2014, and is based on Japanese Patent Applications No. 2013-264294 filed on Dec. 20, 2013, and No. 2014-248139 filed on Dec. 8, 2014, the disclosures of which are incorporated herein by reference.

TECHNICAL FIELD

The present disclosure relates to a semiconductor device which includes an insulated gate field effect transistor (hereinafter referred to as IGBT) and a free wheel diode (hereinafter simply referred to as diode), both formed on one substrate.

BACKGROUND ART

Patent Literature 1 proposes a semiconductor device which includes an IGBT for a circuit such as an inverter, and a diode disposed parallel to the IGBT. The semiconductor device disclosed in Patent Literature 1 controls lifetime by a method specifically described below.

Specifically, one substrate on which an IGBT and a diode are formed by a semiconductor process is prepared. Ions are implanted into the positions of the IGBT and the diode from the front surface side of the substrate, while ions are implanted into the position of the diode from the rear surface side of the substrate. The ion-implanted substrate is annealed. As a result, defects for lifetime control are formed at the ion-implanted positions.

PRIOR ART LITERATURES

Patent Literature

Patent Literature 1: JP-2008-4866-A

SUMMARY OF INVENTION

Object to be Solved by Invention

According to the lifetime control described in Patent Literature 1, however, a gate insulation film formed on a trench inner wall surface is damaged by ion implantation when a trench constituting a trench gate structure is present at the position of ion implantation. The damaged gate insulation film is recoverable by annealing at a high temperature. However, annealing is not allowed at a temperature of 380° C. or higher at which the defects formed for the lifetime control are recoverable.

On the other hand, it has also been generally performed to implant ions to the entire region of the positions of the IGBT and the diode from the rear surface side of the substrate for lifetime control. According to this method, however, lifetime control for the IGBT and the diode simultaneously performed is difficult to be optimized separately for the IGBT and the diode. In particular, characteristics of the IGBT may be degraded by lifetime control, and therefore minimized lifetime control is preferable.

In consideration of the aforementioned circumstances, an object of the present disclosure is to provide a semiconductor device capable of optimizing characteristics separately for an IGBT and a diode while avoiding damage to a gate insulation film caused by ion implantation, and minimizing or preferably eliminating the need of lifetime control.

Means for Achieving Object

According to an aspect of the present disclosure, a semiconductor device includes: an IGBT section including a vertical IGBT; a diode section arranged along the IGBT section and including a diode; a drift layer; a collector region; a cathode region; a second conductivity type region; a plurality of trenches; an emitter region; a hole injection reduction layer; a gate insulation film; a gate electrode; an upper electrode; and a lower electrode.

The drift layer has a first conductivity type. The collector region has a second conductivity type and is arranged on a rear surface side of the drift layer in the IGBT section. The cathode region has the first conductivity type and is arranged on the rear surface side of the drift layer in the diode section. The second conductivity type region is arranged in a surface layer portion on a front surface side of the drift layer in both the IGBT section and the diode section. The plurality of trenches are arranged in the IGBT section, extend to a depth deeper than the second conductivity type region, and divide the second conductivity type region into a plurality of parts to provide a channel region constituted by at least a part of the second conductivity type region. The emitter region has the first conductivity type and is arranged in a surface layer portion of the channel region in the IGBT section along a side surface of each trench. The hole injection reduction layer has the first conductivity type, is arranged in an upper layer portion of the drift layer in the diode section, extends to a depth deeper than an anode region constituted by the second conductivity type region in the diode section, has an impurity concentration lower than an impurity concentration of the anode region and higher than an impurity concentration of the drift layer. The gate insulation film is arranged on a surface of each trench. The gate electrode is arranged on a surface of the gate insulation film. The upper electrode is electrically connected with the second conductivity region in the IGBT section, and is electrically connected with the anode region. The lower electrode is electrically connected with the collector region in the IGBT section, and is electrically connected with the cathode region in the diode section.

The semiconductor device includes the hole injection reduction layer in the diode section. This structure reduces holes injected through the diode section during operation of the IGBT, thereby decreasing an AC loss at the time of switching. Moreover, the AC loss and a DC loss having a trade-off relationship with the AC loss are adjustable in accordance with the impurity concentration of the hole injection reduction layer. Accordingly, the hole injection reduction layer included in the diode section and capable of optimizing settings of the AC loss and the DC loss realizes separate optimization of characteristics for the IGBT and the diode.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinafter, embodiments according to the present disclosure will be described with reference to the drawings. In the embodiments described below, identical or similar parts are given identical reference numbers.

First Embodiment

Figure 1:
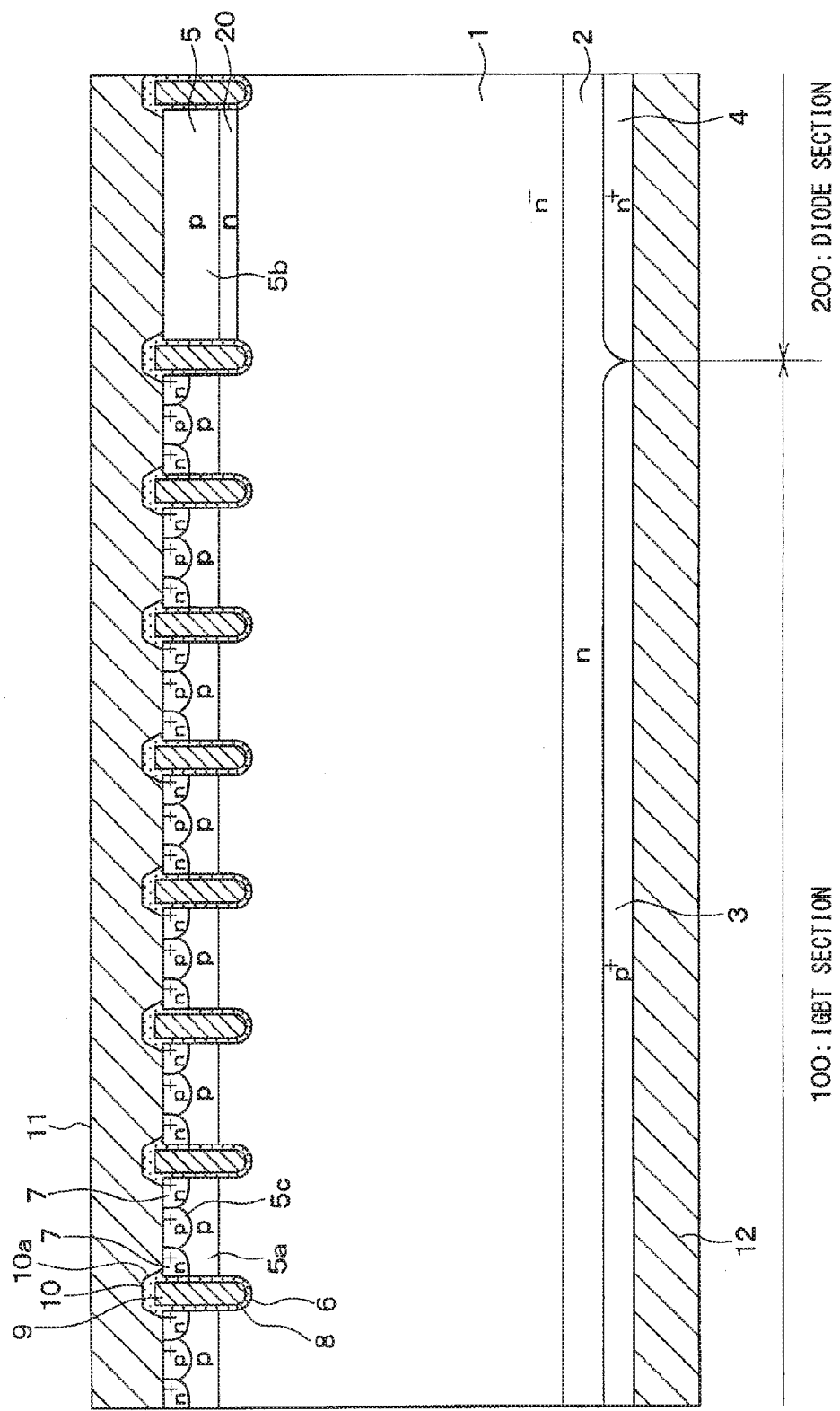
FIG. 1 is a cross-sectional view of a semiconductor device including an IGBT and a diode according to a first embodiment of the present disclosure.

A first embodiment according to the present disclosure will be hereinafter described. As illustrated in FIG. 1, a semiconductor device according to this embodiment includes a vertical IGBT and a vertical diode provided on one substrate to supply current in a substrate thickness direction. Specifically, the semiconductor device according to this embodiment is configured as detailed below.

As illustrated in FIG. 1, the semiconductor device according to this embodiment includes an IGBT section 100 containing an IGBT, and a diode section 200 provided along the IGBT section 100 and containing a diode. The IGBT section 100 and the diode section 200 are formed in a cell region at a central portion of a chip, for example. An outer circumferential high breakdown voltage portion, not shown, is provided along the outer circumference of the cell region, i.e., an outer edge of the chip to constitute the semiconductor device according to this embodiment.

Each of the IGBT and the diode is produced from a semiconductor substrate constituting an n$^-$ type drift layer 1. A field stop (hereinafter referred to as FS) layer 2 constituted by an n type layer is formed in a surface layer portion of the n$^-$ type drift layer 1 disposed on the rear surface side of the n$^-$ type drift layer 1 in the IGBT section 100 and the diode section 200. The FS layer 2 extending from the rear surface of the n$^-$ type drift layer 1 to a predetermined depth of a relatively shallow position is formed by implanting n type impurities such as phosphorus (P). The concentration and the diffusion depth of the impurities of the FS layer 2 are determined in accordance with the required characteristics of the IGBT and the diode.

A collector region 3 constituted by a p$^+$ type impurity layer is formed in a surface layer portion of the FS layer 2 in the IGBT section 100. The collector region 3 is formed by implanting p type impurities such as boron. A cathode region 4 constituted by an n$^+$ type impurity layer is formed in the surface layer portion of the FS layer 2 in the diode section 200. The cathode region 4 is formed by implanting n type impurities such as phosphorus. The concentrations and the diffusion depths of the impurities of the collector region 3 and the cathode region 4 are determined in accordance with the required characteristics of the IGBT and the diode.

A p type region 5 is formed in a surface layer portion of the n$^-$ type drift layer 1 on the front surface side in both the IGBT section 100 and the diode section 200. A plurality of trenches 6, configured to penetrate the p type region 5 and reach the n$^-$ type drift layer 1, divide the p type region 5 into a plurality of parts. Specifically, the plurality of trenches 6 formed with a predetermined pitch (intervals) extend in parallel with each other in the vertical direction with respect to the sheet surface of FIG. 1 to form a stripe structure, or extend in parallel and connect with each other at the tips thereof in an annular shape to form an annular structure. This annular structure forms a multiple ring structure constituted by sets of the trenches 6, for example. Each of these sets is constituted by a plurality of the trenches 6.

Channel p type regions 5a corresponding to a part of the plurality of parts of the p type region 5 divided by the trenches 6 are located in the IGBT section 100. The channel p type regions constitute channel regions. Emitter regions 7 constituted by an n$^+$ type impurity layer are formed in surface layer portions of the channel p type regions 5a.

High-concentration body p type regions 5c, also functioning as contact portions of the channel p type region 5a, are formed in the surface layer portions of the channel p type regions 5a of the p type region 5, specifically, between the emitter regions 7 disposed within the channel p type regions 5a along both sides thereof. Accordingly, the IGBT section 100 has a high concentration of p type impurities on the surface of the p type region 5.

Each of the emitter regions 7 has a higher impurity concentration than the n$^-$ type drift layer 1, is terminated within the p type region 5, and brought into contact with the side surface of the corresponding trench 6. Specifically, each of the emitter regions 7 is extended in a bar shape in the longitudinal direction of the trench 6, and is terminated inside with respect to the tip of the trench 6.

Each of the trenches 6 is configured to reach a position deeper than the p type region 5, and disposed with a predetermined pitch as discussed above, as illustrated in a cross-sectional view of FIG. 1. Each of the trenches 6 is filled with a gate insulation film 8 covering the inner wall surface of the corresponding trench 6, and a gate electrode 9 constituted by doped Poly-Si or the like formed on the surface of the gate insulation film 8. The gate electrodes 9 formed in the IGBT section 100 are electrically connected with each other in a cross-sectional view different from FIG. 1 so that a gate voltage of an identical potential can be applied to the gate electrodes 9.

The emitter regions 7 and the channel p type regions 5$a$ are electrically connected with an upper electrode 11 via contact holes 10$a$ formed in interlayer insulation films 10. The upper electrode 11 constitutes an emitter electrode. A passivation film, not shown, is provided to protect the upper electrode 11, wires, and the like. A lower electrode 12 constituting a collector electrode is formed on the rear surface side of the collector region 3 to complete the IGBT.

An anode region 5$b$ corresponding to a part of the plurality of parts of the p type region 5 divided by the trenches 6 is located in the diode section 200. A surface layer portion of the anode region 5$b$ has a relatively high concentration to constitute a contact region. The foregoing upper electrode 11 extends to the diode section 200, and makes ohmic connection with the anode region 5$b$ to function as an anode electrode as well. The foregoing lower electrode 12 extends to the diode section 200, and makes ohmic connection with a cathode region 4 to function as a cathode electrode as well. The diode is constituted by these components.

Figure 2:
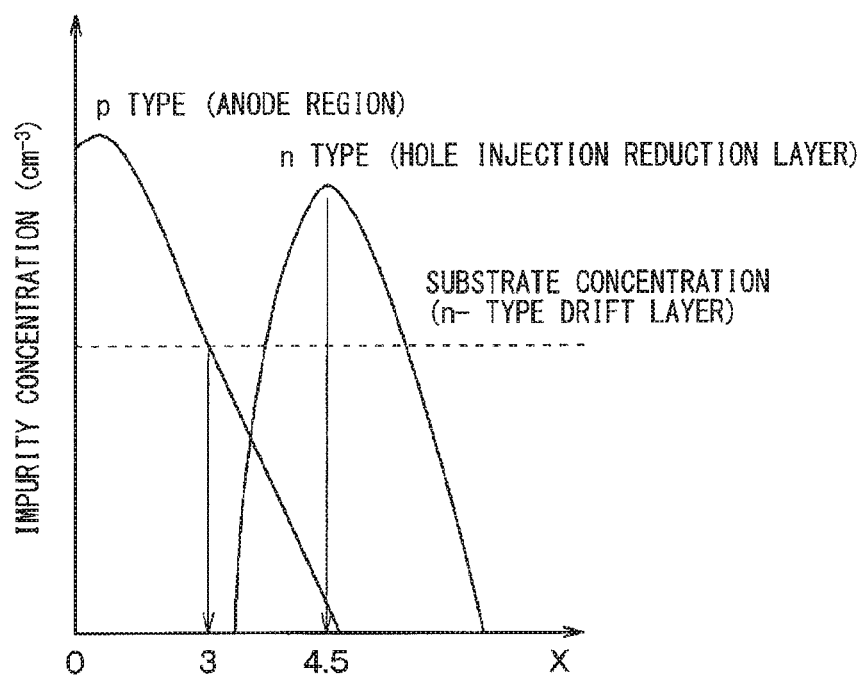
FIG. 2 is a view showing impurity concentration distributions of a p type region and a hole injection reduction layer.

According to this embodiment, the diode section 200 thus configured includes a hole injection reduction layer 20 constituted by an n type layer. The hole injection reduction layer 20 formed in an upper layer portion of the n$^-$ type drift layer 1 performs a function of reducing injection of holes from the anode region 5$b$. The hole injection reduction layer 20 is disposed at a position deeper than the anode region 5$b$, and shallower than the bottoms of the trenches 6. The impurity concentration of the hole injection reduction layer 20 is higher than the impurity concentration of the n$^-$ type drift layer 1. In addition, the impurity concentration peak value of the hole injection reduction layer 20 is set to a value lower than the impurity concentration peak value of the anode region 5$b$ as illustrated in FIG. 2. For example, the impurity concentration of the n$^-$ type drift layer 1 is set in a range from $7\times10^{13}$ cm$^3$ to $8\times10^{14}$ cm$^{-3}$, the impurity concentration of the hole injection reduction layer 20 is set in a range from $1\times10^{16}$ cm$^{-3}$ to $1\times10^{17}$ cm$^{-3}$, and the impurity concentration of the anode region 5$b$ is set in a range from $1\times10^{17}$ cm$^{-3}$ or higher, for example. The thickness of the hole injection reduction layer 20 may be arbitrarily determined. For example, this thickness is determined in a range from 1 μm to 2 μm.

According to this embodiment, the bottom of the hole injection reduction layer 20 is located at a position shallower than the bottoms of the trenches 6. However, the bottom of the hole injection reduction layer 20 may be located at a position deeper than the bottoms of the trenches 6.

The semiconductor device including the IGBT and the diode in this embodiment is configured as described above.

Figure 3:
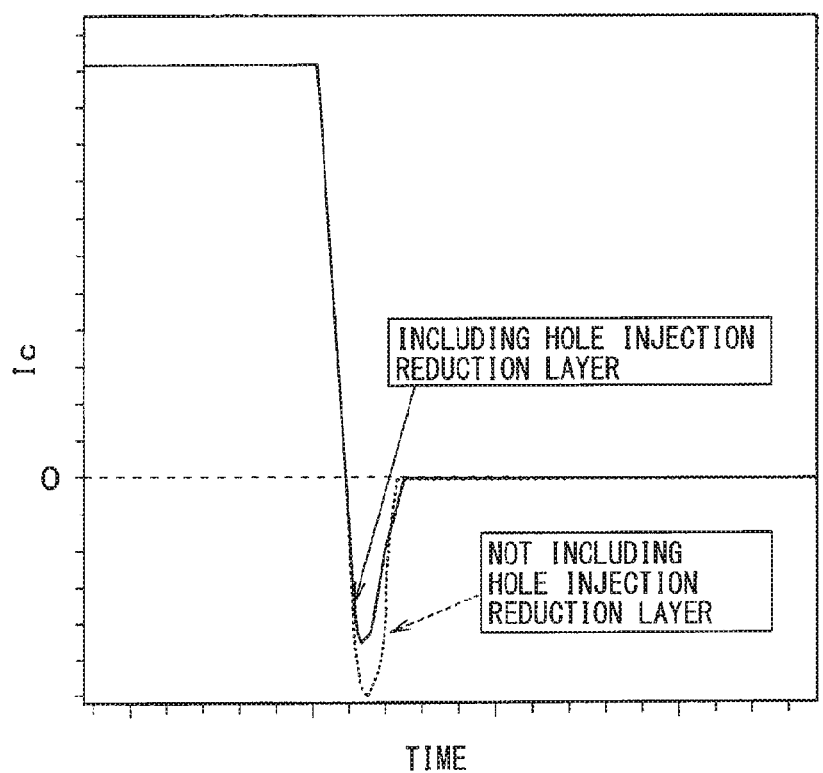
FIG. 3 is a view showing a measurement result of a change of a collector current Ic in an off-state of the IGBT.

According to the semiconductor device thus configured, the hole injection reduction layer 20 is included in the diode section 200. This structure allows reduction of holes injected through the diode section 200 during operation of the IGBT, thereby decreasing an amount of holes required to be extracted in the off-state of the IGBT. In this case, a protrusion amount of overshoot below zero decreases when the collector current Ic becomes zero in the off-state of the IGBT as illustrated in FIG. 3. Accordingly, an AC loss at the time of switching decreases.

Figure 4:
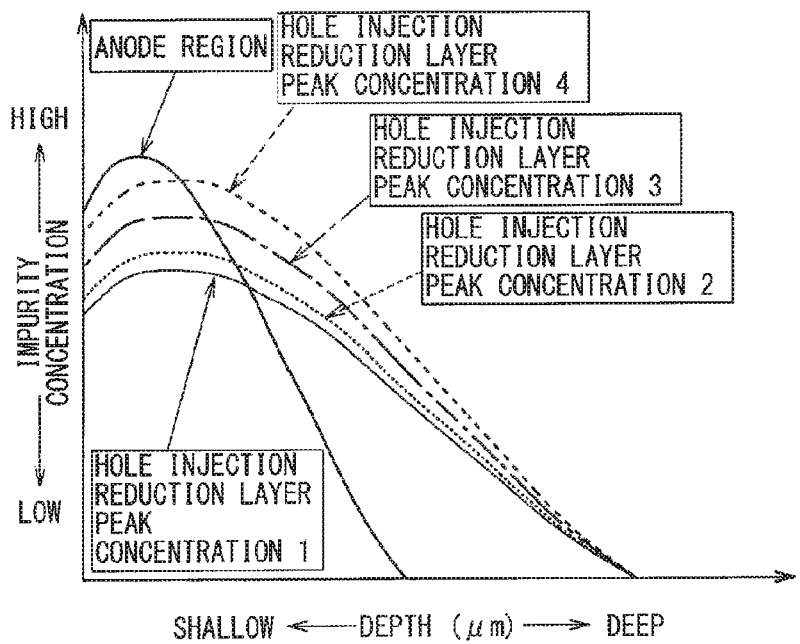
FIG. 4 is a view showing concentration distributions exhibited when an impurity concentration peak of the hole injection reduction layer is varied.
Figure 5:
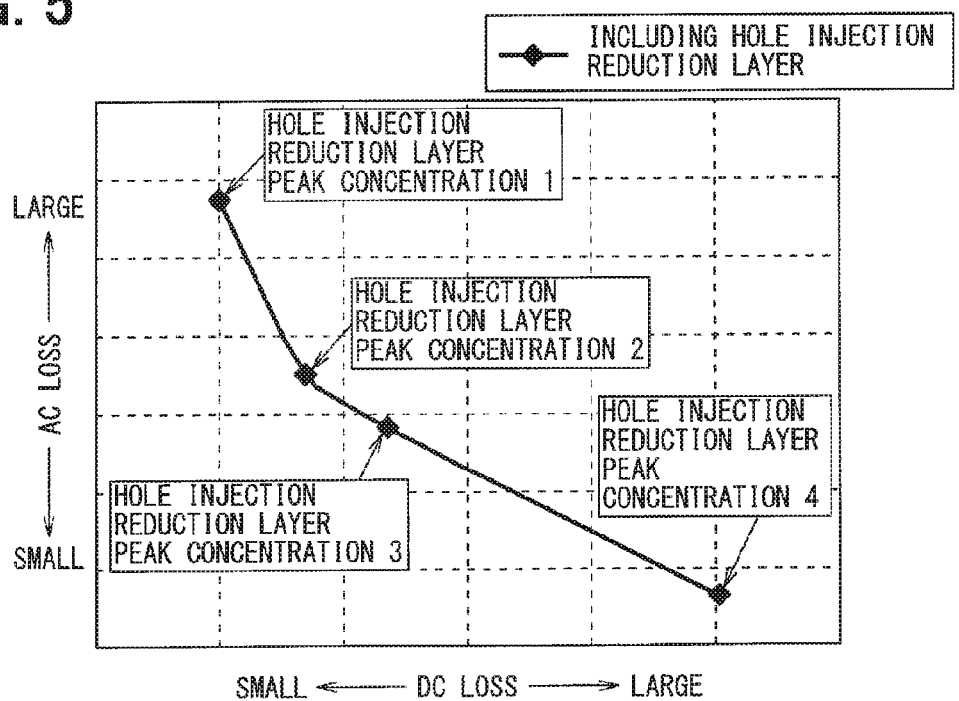
FIG. 5 is a view showing an investigation result of an AC loss and a DC loss obtained when the impurity concentration peak of the hole injection reduction layer is varied.

The hole injection amount decreases as the concentration of the hole injection reduction layer 20 becomes higher. Accordingly, the AC loss further decreases by raising the impurity concentration peak of the hole injection reduction layer 20. However, a DC loss at the time of switching has a trade-off relationship with the AC loss. The DC loss increases as the impurity concentration peak of the hole injection reduction layer 20 becomes higher. For example, a relationship between the AC loss and the DC loss as illustrated in FIG. 5 was obtained from an investigation conducted while varying the impurity concentration peak of the hole injection reduction layer 20 through four levels as illustrated in FIG. 4.

As discussed above, there is a trade-off relationship between the AC loss and the DC loss. These losses are adjustable in accordance with the impurity concentration peak of the hole injection reduction layer 20. In this case, settings of the AC loss and the DC loss are optimized when the impurity concentration peak of the hole injection reduction layer 20 is determined based on required specifications. Accordingly, the hole injection reduction layer 20 included in the diode section 200 and capable of optimizing settings of the AC loss and the DC loss as discussed herein realizes separate optimization of the characteristics for the IGBT and the diode.

Figure 6:
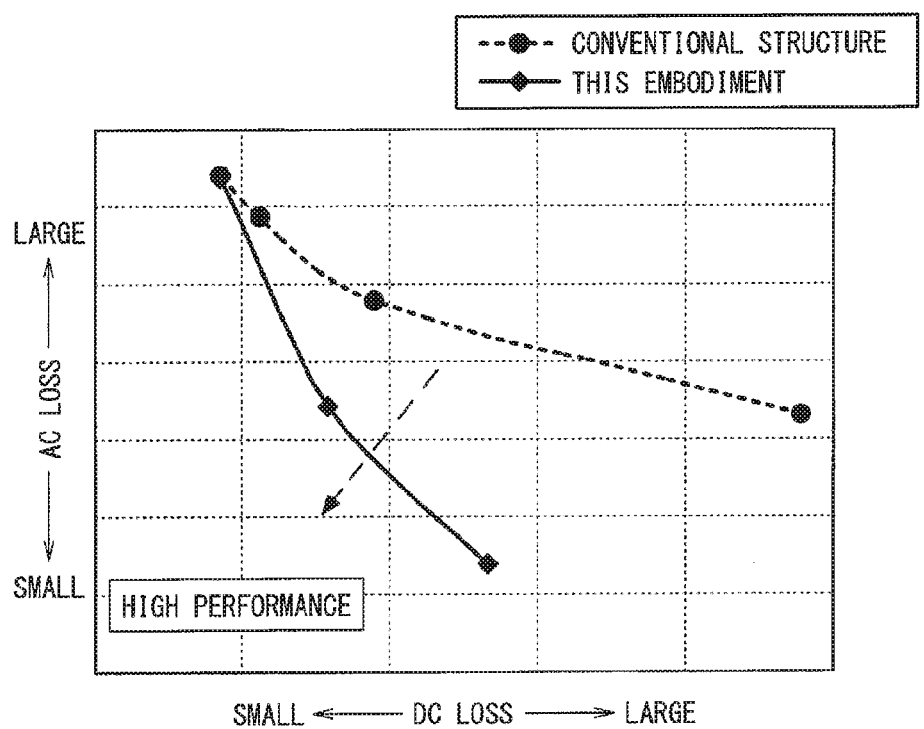
FIG. 6 is a view showing an investigation result of a relationship concerning the AC loss and the DC loss between a structure including the hole injection reduction layer according to a first embodiment and a conventional structure not including the hole injection reduction layer.

In addition, a result illustrated in FIG. 6 was obtained from an investigation of the relationship between the AC loss and the DC loss for each of the structure including the hole injection reduction layer 20 as in this embodiment and a conventional structure not including the hole injection reduction layer 20. As can be seen from the result, improvement of the DC loss is recognizable in the structure according to this embodiment in comparison with the conventional structure on the assumption that the AC loss is the same value for both the structures. It is therefore understood from this investigation that improvement of the performance of the semiconductor device is achievable when the hole injection reduction layer 20 is provided as in this embodiment.

A manufacturing method of the semiconductor device having the foregoing structure is hereinafter described. The semiconductor device constructed as in this embodiment is manufactured by a method substantially similar to a manufacturing method of a semiconductor device having a conventional structure. Accordingly, only points different from the corresponding points of the conventional method are mainly discussed herein.

Initially, a semiconductor substrate constituting the n$^-$ type drift layer 1 is prepared. Ions of n type impurities are implanted into the position of the hole injection reduction layer 20 of the diode section 200. Ions of p type impurities are implanted into the IGBT section 100 and the diode section 200 to form the p type region 5 in the surface layer portion of the n$^-$ type drift layer 1. Ions of p type impurities and n type impurities are implanted into the positions of the body p type regions 5$c$ and the positions of the emitter regions 7, respectively, in the IGBT section 100. An annealing process is performed as a thermal diffusion step to thermally diffuse the implanted ions, thereby forming the hole injection reduction layer 20, the p type region 5, the body p type regions 5c, and the emitter regions 7.

A mask (not shown) opened at positions of the trench gate structures to be formed is disposed on the IGBT section 100 and the diode section 200. Anisotropic etching is performed to form the trenches 6. Steps are performed to form the gate insulation films 8 by thermal oxidation and to form gate electrodes 9 by film formation of doped polysilicon and patterning. The interlayer insulation films 10 are formed, and then steps are performed to form the contact holes 10a and to form the upper electrode 11 by patterning an electrode material such as Al. The steps for manufacturing the substrate front surface side are now completed.

Subsequently, the rear surface side of the semiconductor substrate constituting the n⁻ type drift layer 1 is ground to a desired thickness, and etched as necessary to flatten the surface. Ion implantation of phosphorous for forming the FS layer 2, ion implantation of boron for forming the collector region 3, and ion implantation of phosphorous for forming the cathode region 4 are performed. Local thermal processing not affecting the front surface side, such as laser annealing, is performed as a step for diffusing the implanted ions. A step for forming the lower electrode 12 is performed, including film formation of an electrode material such as Al. The steps for manufacturing the substrate rear surface side are now completed. The semiconductor device including the IGBT and the diode illustrated in FIG. 1 is finally manufactured.

According to this manufacturing method, the hole injection reduction layer 20 included in the structure thus manufactured allows separate optimization of the characteristics of the diode from optimization of the characteristics of the IGBT. This manufacturing method therefore eliminates the necessity of ion implantation for lifetime control from the front surface side of the substrate after formation of the trench gate structures. Accordingly, separate optimization of the characteristics for the IGBT and the diode is realizable without damaging the gate insulation films 8 caused by ion implantation, while minimizing or preferably eliminating the necessity of lifetime control.

Second Embodiment

A second embodiment according to the present disclosure will be hereinafter described. This embodiment is similar to the first embodiment except for the structure of the IGBT section 100. Accordingly, only points different from the corresponding points in the first embodiment are described.

Figure 7:
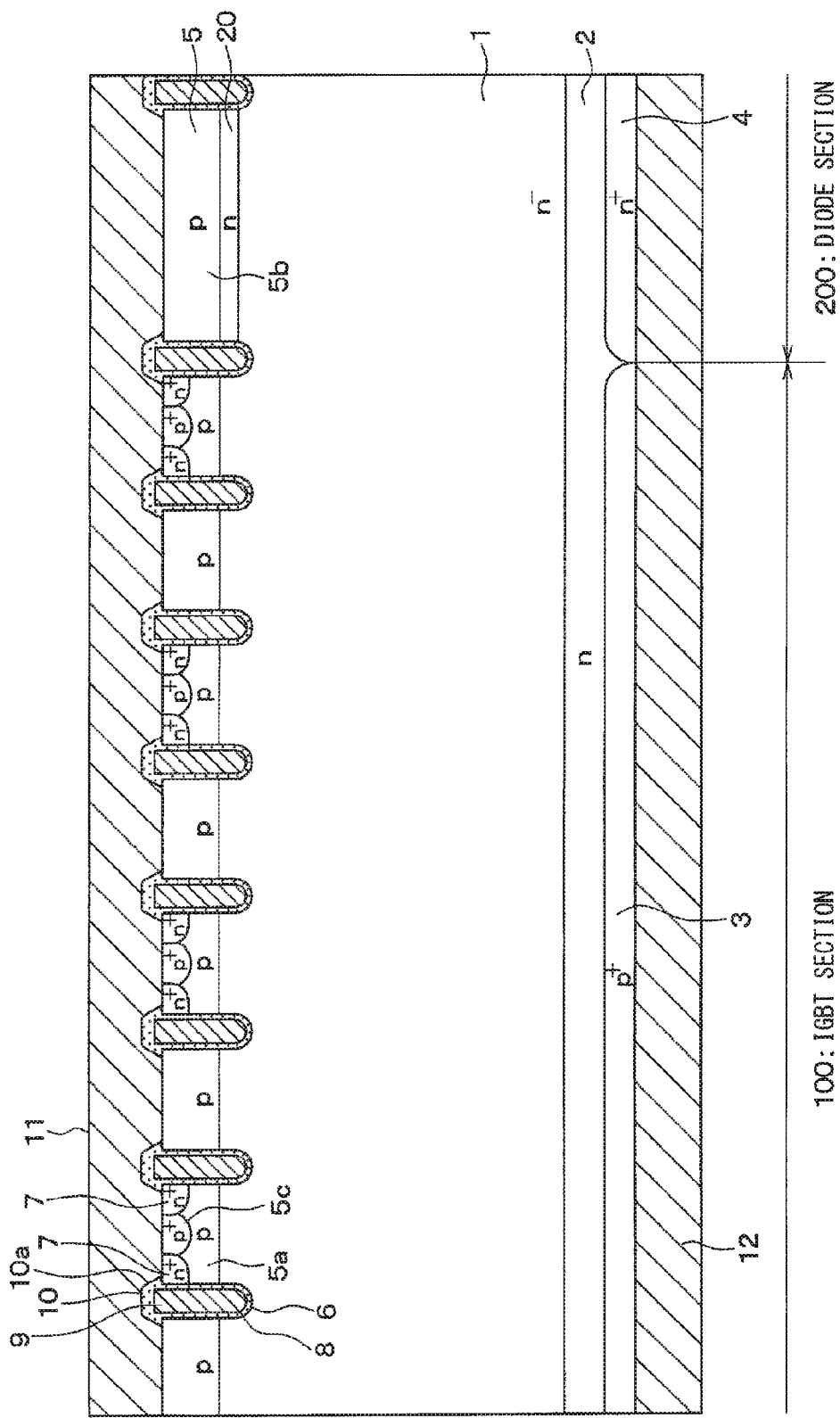
FIG. 7 is a cross-sectional view of a semiconductor device including an IGBT and a diode according to a second embodiment of the present disclosure.

As illustrated in FIG. 7, in this embodiment, the channel p type regions 5a provided in the IGBT section 100 are formed only in a part of the plurality of parts of the p type region 5 divided by the trenches 6. In other words, the emitter regions 7 constituted by n⁺ type impurities are formed only in a part of the p type region 5. The channel p type regions 5a containing the emitter regions 7 correspond to IGBT operation portions performing IGBT operation. On the other hand, the remaining portions of the p type region 5 not containing the emitter regions 7 correspond to decimated portions not performing IGBT operation.

In this case, the diode section 200 having a structure similar to the structure of the first embodiment is allowed even when the IGBT operation portions extend not through the entire region of the IGBT section 100, but only in a part of the IGBT section 100 other than the decimated portions.

Even in this structure, advantageous effects similar to the advantageous effects of the first embodiment are offered.

Third Embodiment

A third embodiment of the present disclosure will be hereinafter described. This embodiment is similar to the first and second embodiments except that the position of the hole injection reduction layer 20 is expanded from the corresponding position of the first and second embodiments. Accordingly, only points different from the corresponding points in the first and second embodiments are described. Discussed in this embodiment is an example which expands the position of the hole injection reduction layer 20 from the corresponding position of the second embodiment. However, this structure is similarly applicable to the first embodiment.

Figure 8:
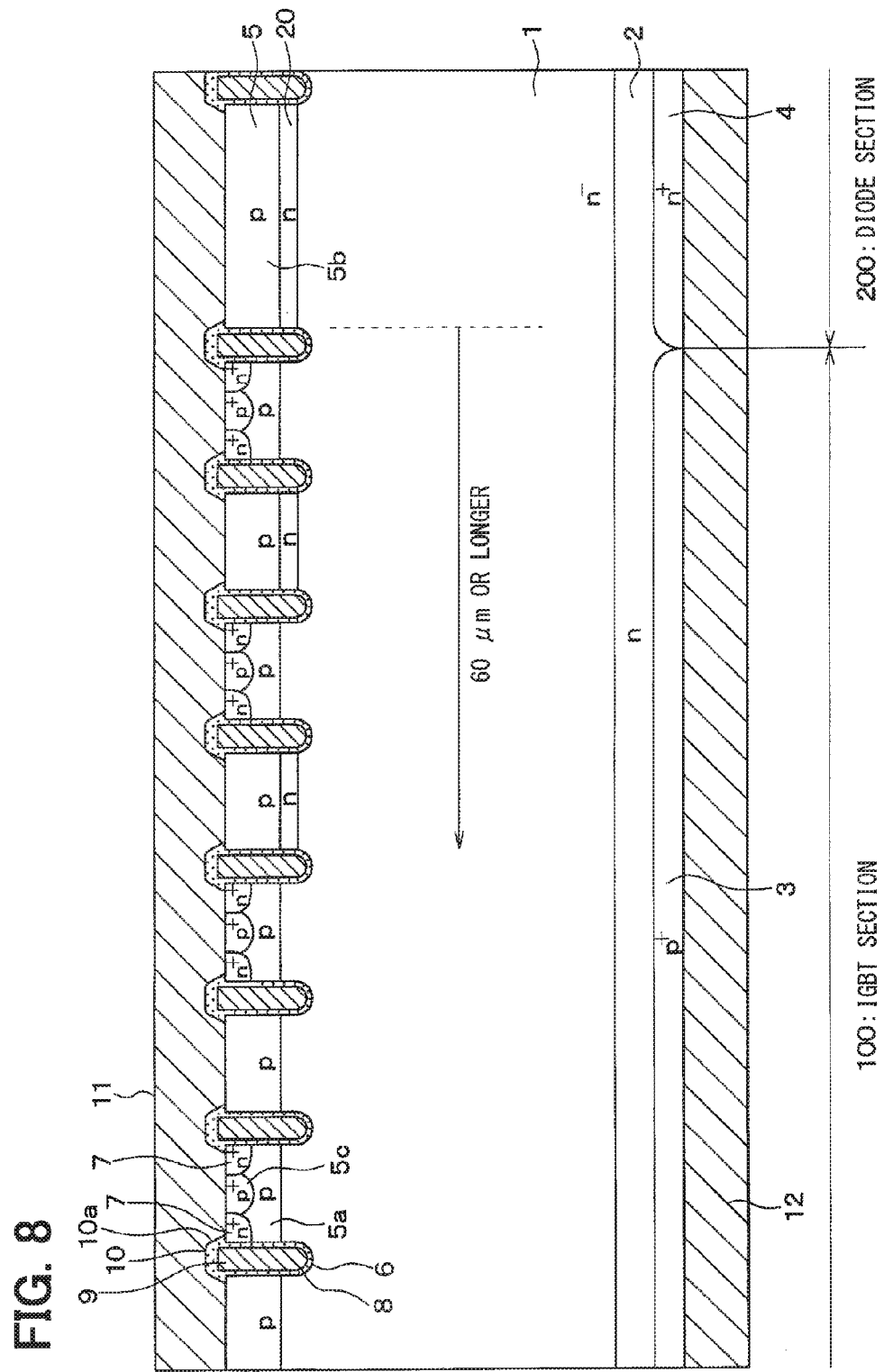
FIG. 8 is a cross-sectional view of a semiconductor device including an IGBT and a diode according to a third embodiment of the present disclosure.

As illustrated in FIG. 8, in this embodiment, a part of the p type region 5 corresponds to decimated portions similarly to the second embodiment. Moreover, the hole injection reduction layer 20 is expanded to a portion of the IGBT section 100 in the vicinity of the diode section 200 as illustrated in FIG. 8. In other words, the hole injection reduction layer 20 protrudes toward the IGBT section 100. Specifically, the hole injection reduction layer 20 in the IGBT section 100 reaches a position of 60 μm or longer from the boundary between the IGBT section 100 and the diode section 200.

Figure 9:
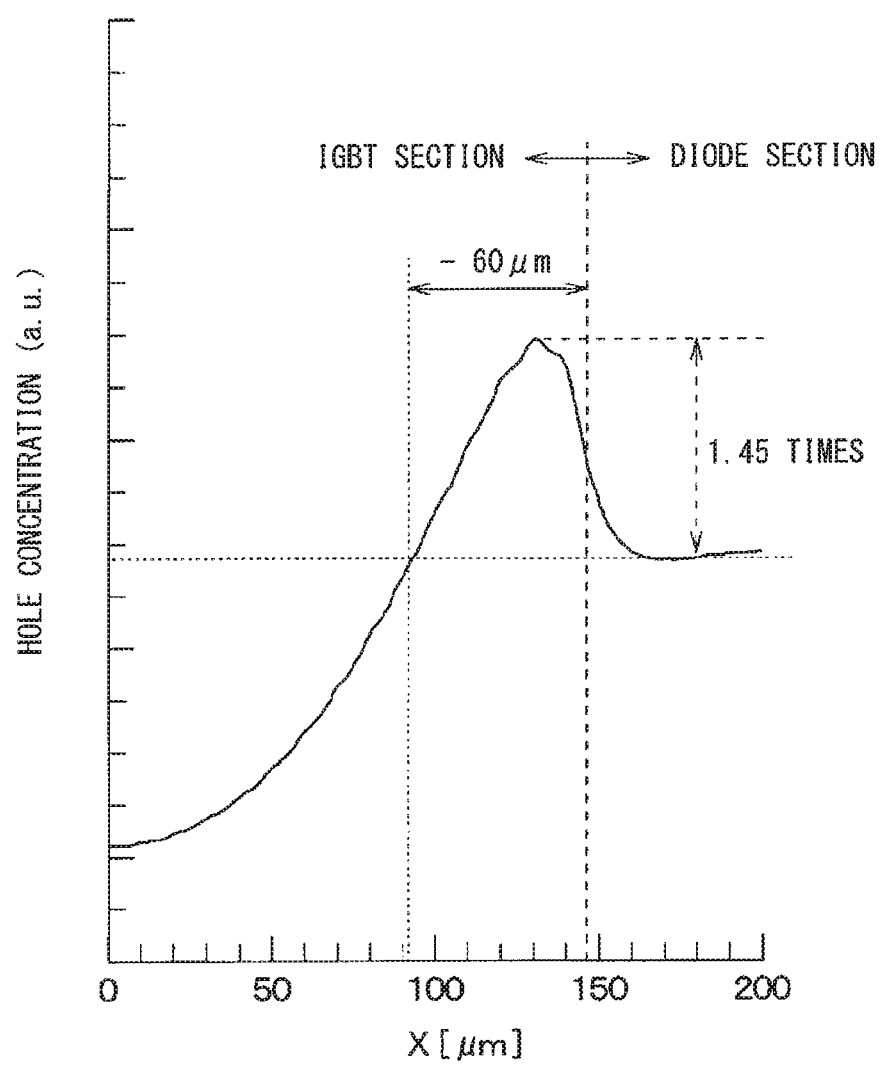
FIG. 9 is a view illustrating a hole distribution produced when the IGBT section does not include a hole injection reduction layer.

FIG. 9 shows a result obtained from an investigation of hole distribution exhibited when the IGBT section 100 does not include the hole injection reduction layer 20 as in the first embodiment, i.e., a hole concentration at a depth of 10 μm from the surface of the p type region 5. According to this experiment, the thickness of the semiconductor substrate, i.e., the thickness of the n⁻ type drift layer 1 in a state before formation of the diffusion layers (total thickness of n⁻ type drift layer 1, collector region 3, channel p type regions 5a, and emitter regions 7 after formation of diffusion layers) is set to 75 μm. The impurity concentration (peak value) of the body p type regions 5c is set to $3\times10^{15}$ cm⁻³. As can be seen from the figure, the hole density in the portion of the IGBT section 100 becomes higher in the vicinity of the diode section 200.

As described above, the hole injection reduction layer 20 included in the diode section 200 reduces holes injected through the diode section 200 during IGBT operation, thereby reducing the AC loss at the time of switching. In an actual situation, however, holes injected through the IGBT section 100 also affect the AC loss. In particular, hole injection from a position of the IGBT section 100 in the vicinity of the diode section 200 gives a considerable effect.

According to this embodiment, therefore, the hole injection reduction layer 20 is formed in the portion of the higher hole density in the IGBT section 100 than that in the diode section 200, i.e., at least up to the position of 60 μm from the boundary between the IGBT section 100 and the diode section 200. This structure reduces the effect on the AC loss imposed by hole injection from the IGBT section 100, thereby further reducing the AC loss.

Figure 10:
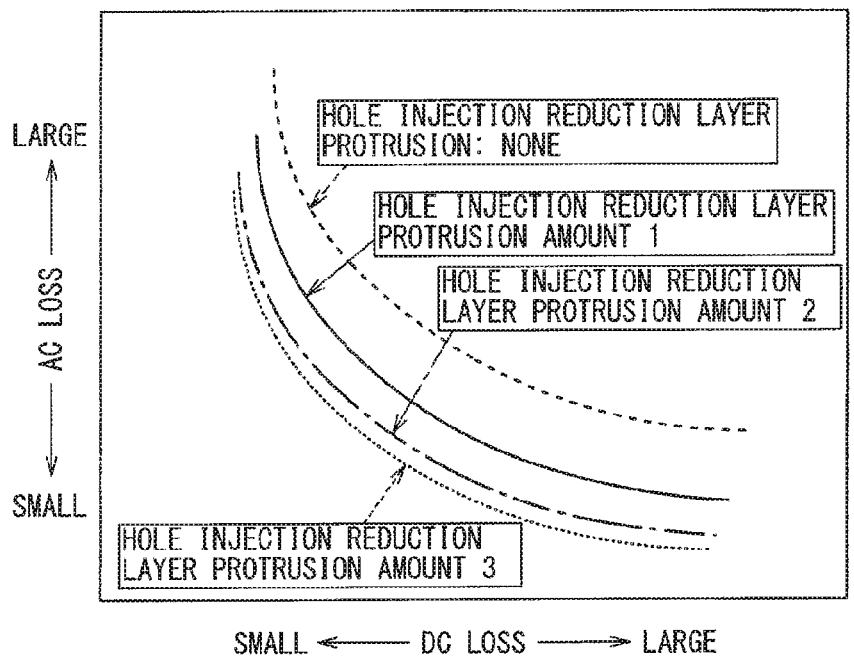
FIG. 10 is a view showing an investigation result of an AC loss and a DC loss obtained when a protrusion amount of the hole injection reduction layer is varied.
Figure 11:
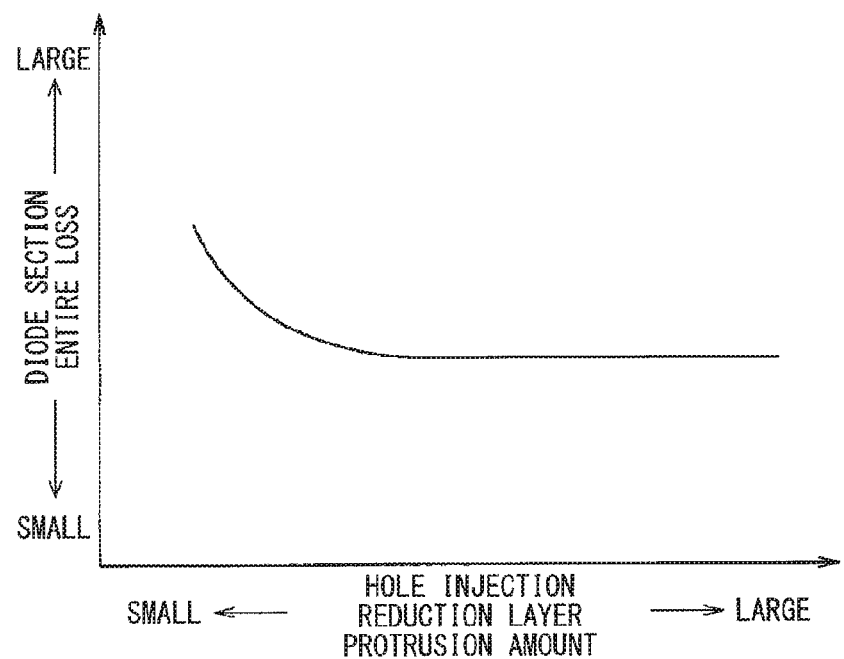
FIG. 11 is a view showing an investigation result of a total loss in a diode section obtained when the protrusion amount of the hole injection reduction layer is varied.

Investigations were carried out as a reference to obtain the AC loss and the DC loss while varying the protruding amount of the hole injection reduction layer 20, and the entire loss in the diode section 200. FIGS. 10 and 11 show results obtained from these investigations. It was found from the result shown in FIG. 10 that performance improves as the protruding amount increases (protruding amount 1<protruding amount 2<protruding amount 3). However, as illustrated in FIG. 11, when the protruding amount reaches a certain amount, the entire loss of the diode section 200 remains at a substantially constant value. It is understood from these results that the performance of the semiconductor device further improves when the hole injection reduction layer 20 protrudes to a part of the IGBT section 100.

Fourth Embodiment

A fourth embodiment of the present disclosure will be hereinafter described. This embodiment is similar to the second and third embodiments except that a hole stopper layer is additionally provided in the structures of the second and third embodiments. Accordingly, only points different from the corresponding points in the second and third embodiments are described. Discussed in this embodiment is an example which adds the hole stopper layer to the structure of the third embodiment. However, this structure is similarly applicable to the second embodiment.

Figure 12:
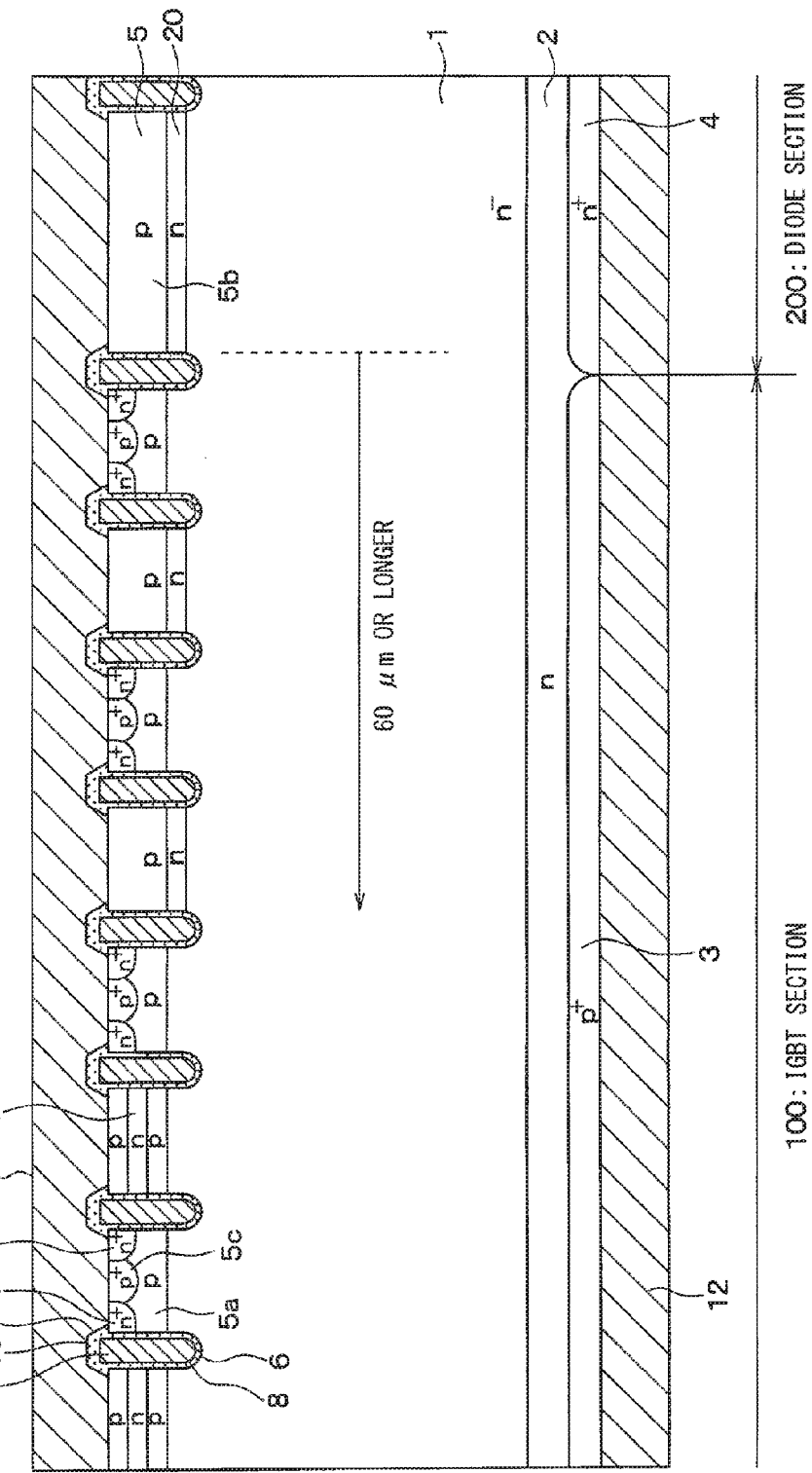
FIG. 12 is a cross-sectional view of a semiconductor device including an IGBT and a diode according to a fourth embodiment of the present disclosure.

According to this embodiment, a part of the p type region 5 corresponds to decimated portions, and the hole injection reduction layer 20 is provided in a portion of the IGBT section 100 in the vicinity of the diode section 200 as illustrated in FIG. 12, similarly to the third embodiment. Moreover, a hole stopper layer 30 is provided in the decimated portions in this embodiment.

The hole stopper layer 30 is formed in the decimated portions of the p type region 5. The hole stopper layer 30 constituted by an n type layer prevents separation of holes from the decimated portions of the p type region 5 after injection of the holes into the n⁻ type drift layer 1. The hole stopper layer 30 divides the decimated portions of the p type region 5 into upper and lower regions in the depth direction of the trenches 6 to produce potentially separated upper and lower regions.

As described above, the hole stopper layer 30 may be additionally provided. In this case, the hole stopper layer 30 may be eliminated in the portion of the IGBT section 100 in the vicinity of the diode section 200, i.e., in the portion where the hole injection reduction layer 20 is provided, as illustrated in FIG. 10.

Fifth Embodiment

A fifth embodiment of the present disclosure will be hereinafter described. This embodiment is similar to the first to fourth embodiments except that the position of the hole injection reduction layer 20 protruding toward the IGBT section 100 as in the first to fourth embodiments is specifically designated. Accordingly, only points different from the corresponding points in the first to fourth embodiments are described. Discussed in this embodiment is an example which expands the position of the hole injection reduction layer 20 in the structure of the first embodiment. However, this structure is similarly applicable to the second to fourth embodiments.

Figure 13:
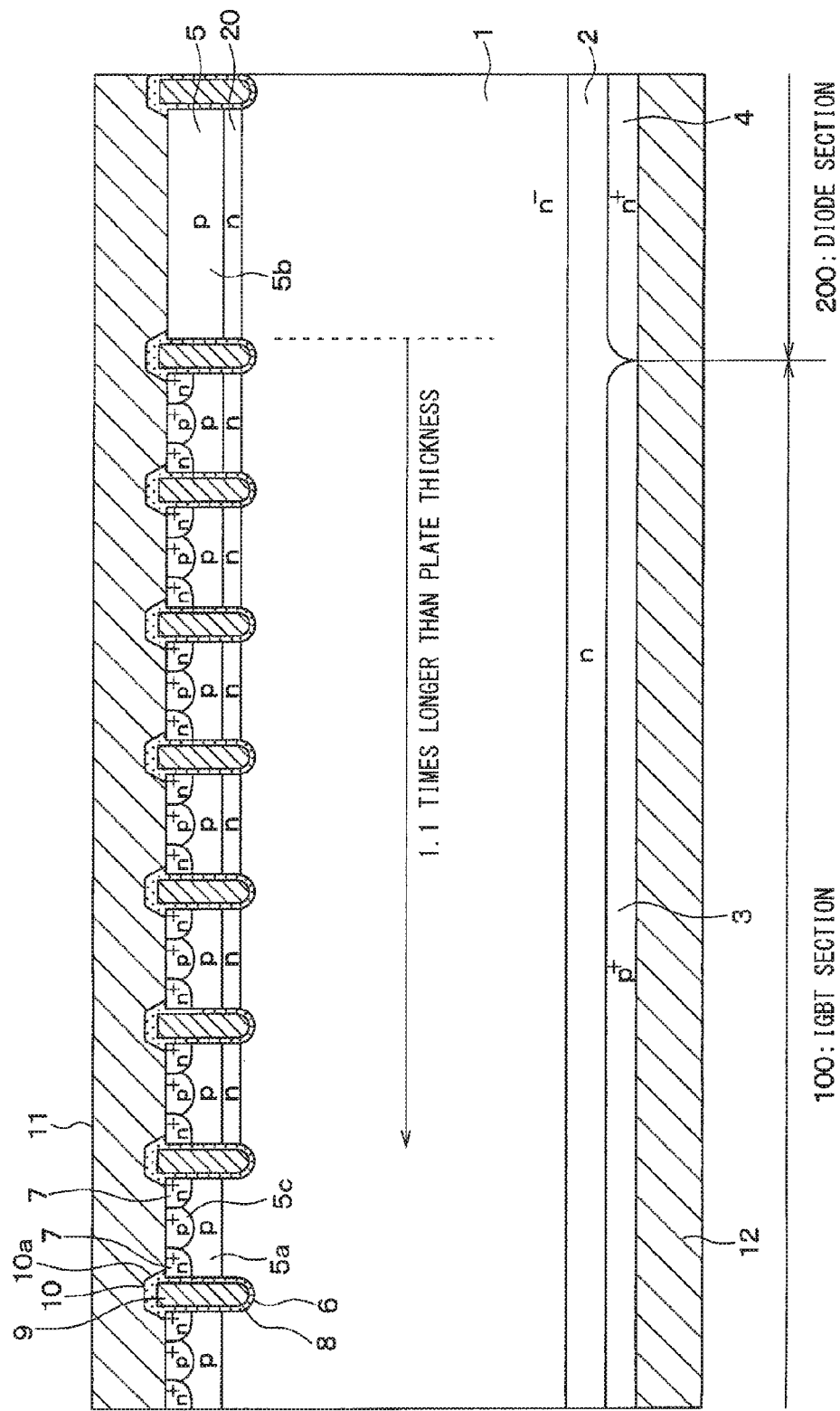
FIG. 13 is a cross-sectional view of a semiconductor device including an IGBT and a diode according to a fifth embodiment of the present disclosure.

According to this embodiment, the body p type regions $5c$ and the emitter regions 7 are formed in the surface layer portion of the p type region 5 between the trench gate structures in the IGBT section 100 as illustrated in FIG. 13 similarly to the first embodiment. All of the body p type regions $5c$ and the emitter regions 7 correspond to the IGBT operation portions. According to this structure, the hole injection reduction layer 20 is also provided in a portion of the IGBT section 100 in the vicinity of the diode section 200. In other words, the hole injection reduction layer 20 protrudes toward the IGBT section 100. Specifically, the hole injection reduction layer 20 formed in the IGBT section 100 extends to a position 1.1 times longer or more than the plate thickness of the semiconductor substrate from the boundary between the IGBT section 100 and the diode section 200 at the impurity concentration (peak value) of the body p type regions $5c$ set to $6\times10^{15}$ cm$^{-3}$ or higher.

Figure 14:
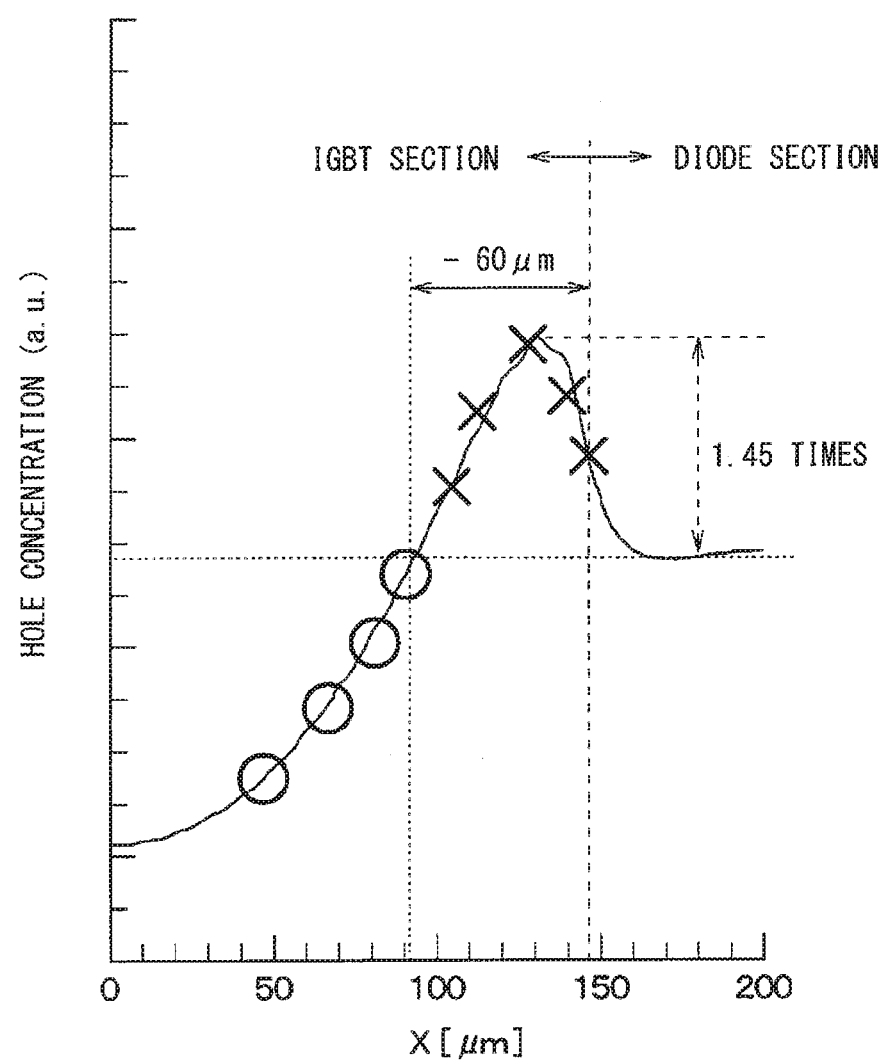
FIG. 14 is a view showing a hole distribution exhibited when an IGBT section does not include a hole injection reduction layer, and a comparison result between a hole density in the IGBT section and a hole density in a diode section.
Figure 15:
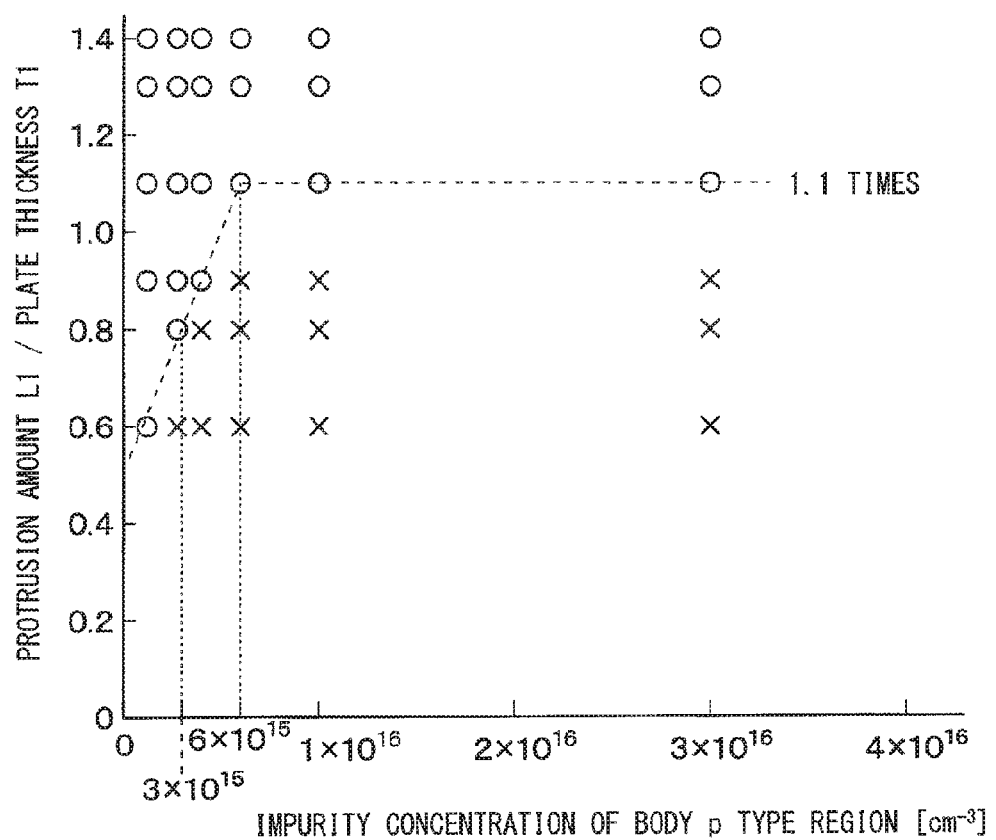
FIG. 15 shows a relationship of a ratio L1/T1 of a protrusion amount L1 and a plate thickness T1 for a change of an impurity concentration of body p type regions.

It has been confirmed from an experiment that the position of the hole injection reduction layer 20 is dependent on the plate thickness of the semiconductor substrate and the impurity concentration of the body p type regions $5c$ when the impurity concentration of the body p type regions $5c$ is low, and dependent on the plate thickness of the semiconductor substrate when the impurity concentration of the body p type regions $5c$ becomes higher. Specifically, the level of protrusion of holes toward the IGBT section 100 was investigated while varying an impurity concentration Pa of the body p type regions $5c$ in a structure not including the hole injection reduction layer 20. In other words, a region of the IGBT section 100 containing a larger amount of carriers than an amount of carriers in the diode section 200 was investigated to obtain the level of a protrusion amount L1 of the corresponding region in the IGBT section 100 from the boundary between the IGBT section 100 and the diode section 200. According to this example, simulation analysis was conducted for a constitution not including the hole injection reduction layer 20 in the structure illustrated in FIG. 1 to obtain a hole diffusion width. A portion of the IGBT section 100 containing a larger amount of carriers (hole density) than the amount of carriers in the diode section 200 was indicated as X, while a portion of the IGBT section 100 containing a smaller amount of carriers was indicated as O as illustrated in FIG. 14. A relationship between a change of the impurity concentration Pa and a ratio of the protrusion amount L1 to a plate thickness T1 was investigated. FIG. 15 shows a relationship thus obtained.

As can be seen from FIG. 15, the ratio L1/T1 of the protrusion amount L1 to the plate thickness T1 at which the carrier amount relationship between the IGBT section 100 and the diode section 200 switches is variable in a range of the impurity concentration Pa of the body p type regions $5c$ of $6\times10^{15}$ cm$^{-3}$ or lower. Specifically, a lower limit of the ratio L1/T1 at which the amount of carriers in the IGBT section 100 becomes smaller than the amount of carriers in the diode section 200 increases as the impurity concentration Pa becomes higher. In this case, the amount of carriers in the IGBT section 100 does not become smaller than the amount of carriers in the diode section 200 unless the protrusion amount L1 increases with a rise of the impurity concentration Pa.

However, the ratio L1/T1 of the protrusion amount L1 to the plate thickness T1 at which the carrier amount relationship between the IGBT section 100 and the diode section 200 switches is constant in a range of the impurity concentration Pa of the body p type region $5c$ of $6\times10^{15}$ cm$^{3}$ or higher. More specifically, the amount of carriers in the IGBT section 100 becomes smaller than the amount of carriers in the diode section 200 regardless of the concentration of the body p type regions $5c$ when the ratio L1/T1 is 1.1 or higher.

Figure 16:
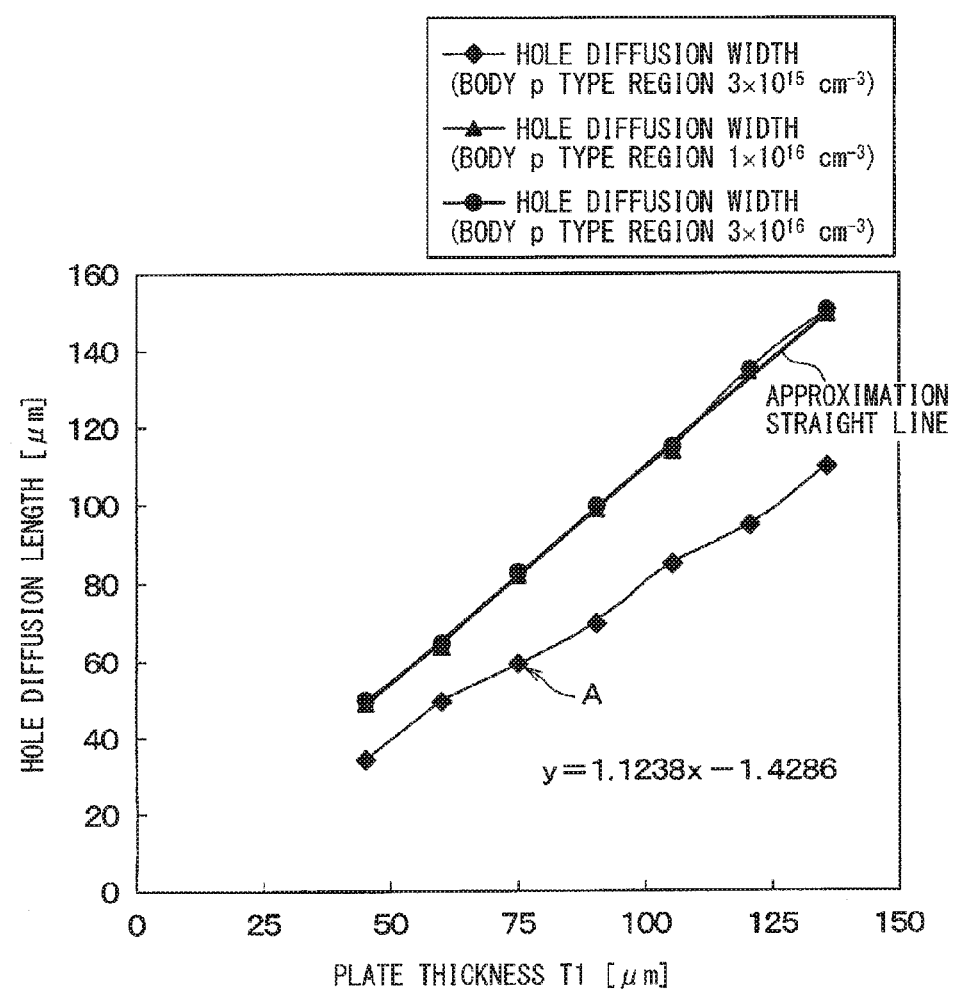
FIG. 16 is a view showing an investigation result of a relationship between the plate thickness T1 and a hole diffusion length obtained when the impurity concentration of the body p type regions is varied.

This phenomenon is produced for the following reason. When the impurity concentration of the body p type regions $5c$ is low, the diffusion of holes decreases. However, when the impurity concentration increases to a certain value, the diffusion of holes becomes dependent on the plate thickness T1 of the semiconductor substrate but independent from the impurity concentration of the body p type regions $5c$. As illustrated in FIG. 16, the hole diffusion length increases with a change of the plate thickness T1 of the semiconductor substrate when the impurity concentration of the body p type regions 5c is $3\times10^{15}$ cm$^{-3}$. However, the rate of increase in the hole diffusion length with respect to the plate thickness T1 slightly deviates from a proportional relationship. However, when the impurity concentration of the body p type region 5c is $1\times10^{15}$ cm$^{-3}$ or $3\times10^{15}$ cm$^{-3}$ the rate of increase in the hole diffusion length with respect to the plate thickness T1 has a proportional relationship. In either case of concentrations, a linear relationship is indicated by the same approximation straight line (y=1.1238x−1.4286 when plate thickness and hole diffusion length are x and y, respectively). This phenomenon is produced by saturation of diffusion of holes at a high impurity concentration of the body p type regions 5c. As a result, the hole diffusion length becomes dependent on the plate thickness T1.

According to this embodiment, therefore, a protrusion amount L of the hole injection reduction layer 20 is determined such that the ratio L1/T1 of the protrusion amount L1 to the plate thickness T1 of the semiconductor substrate becomes 1.1 or higher in a structure of the impurity concentration of the body p type regions 5c set to $6\times10^{15}$ cm$^{-3}$ or higher. In other words, the protrusion amount L of the hole injection reduction layer 20 is so determined as to become at least the length of the protrusion amount L1 of the holes toward the IGBT section 100. This structure reduces an effect of holes on the AC loss after injection of the holes from the IGBT section 100, thereby further decreasing the AC loss.

According to the third embodiment, the plate thickness T1 of the semiconductor substrate is 75 μm, while the impurity concentration of the body p type regions 5c is $3\times10^{15}$ cm$^{-3}$. These conditions correspond to a point A illustrated in FIG. 16, and meet the case when the impurity concentration of the body p type regions 5c is set in the range of $6\times10^{15}$ cm$^{-3}$ or lower. Accordingly, the relationship at the point A in FIG. 15 corresponds to the required ratio of the protrusion amount L of the hole injection reduction layer 20 to the plate thickness T1. The ratio L/T1 of the protrusion amount L of the hole injection reduction layer 20 to the plate thickness T1 is 0.8 at the point A. In this case, the protrusion amount L of the hole injection reduction layer 20 is required to be 60 μm when the plate thickness T1 is 75 μm. According to the third embodiment, the protrusion amount L of the hole injection reduction layer 20 is set to 60 μm or larger, and thus the foregoing effects are realizable.

According to this example, the ratio of the protrusion amount L of the hole injection reduction layer 20 to the plate thickness T1 is determined as 1.1 or higher in the structure of the impurity concentration of the body p type regions 5c set to $6\times10^{15}$ cm$^{-3}$ or higher. However, the protrusion amount L of the hole injection reduction layer 20 may be determined based on the straight line in FIG. 15 indicating the relationship of the ratio L/T1 relative to a change of the impurity concentration of the body p type regions 5c in the structure of the impurity concentration of the body p type regions 5c set to $6\times10^{15}$ cm$^{-3}$ or higher. Specifically, the straight line in FIG. 15 becomes a function expression y=0.1x+0.5 on the assumption that the impurity concentration of the body p type regions 5c is x [$1\times10^{15}$ cm$^{-3}$], and that the ratio L1/T1 of the protrusion amount L1 to the plate thickness T1 is y. Accordingly, the protrusion amount L of the hole injection reduction layer 20 is established such that the ratio L/T1 of the protrusion amount L of the hole injection reduction layer 20 to the plate thickness T1 becomes y (=L1/T1) indicated by this function expression or higher, i.e., L/T1≥y=0.1x+0.5 can be satisfied.

In case of the structure including the decimated portions as in the second to fourth embodiments, injection of holes decreases in the decimated portions. In this case, the hole density of the IGBT section 100 becomes still lower than the hole density of the diode section 200. Accordingly, the amount of carriers becomes smaller in the IGBT section 100 than that in the diode section 200 even when the ratio L/T1 of the protrusion amount L of the hole injection reduction layer 20 to the plate thickness T1 is lower than the relationship shown in FIG. 15. The foregoing effects are therefore offered even in a structure including decimated portions when the ratio of the protrusion amount L of the hole injection reduction layer 20 to the plate thickness T1 is 1.1 or higher in the structure of the impurity concentration of the body p type regions 5c set to $6\times10^{15}$ cm$^{-3}$ or higher.

Other Embodiments

The present disclosure is not limited to the embodiments described herein, but may be modified in appropriate manners.

For example, impurity concentrations and thicknesses of the parts including the hole injection reduction layer 20 are not limited to the numerical values presented in the embodiments by way of example, but may be changed as appropriate. In other words, the impurity concentration of the hole injection reduction layer 20 is only required to be higher than the impurity concentration of the n⁻ type drift layer 1 and exhibit an impurity concentration peak value lower than the impurity concentration peak value of the anode region 5b. In particular, the hole injection reduction layer 20 may be appropriately varied depending on required settings of the AC loss and the DC loss.

According to the embodiments described herein, different pitches of the trenches 6 are set for the IGBT section 100 and the diode section 200. However, the pitches of the trenches 6 for the IGBT section 100 and the diode section 200 may be equalized. In addition, the pitch set of the trench 6 within the IGBT section 100 or the diode section 200 is not required to be uniform, but may be different pitches.

The diode section 200 may include the emitter regions 7 and the body p type regions 5c within the p type region 5 constituting the anode region 5b, similarly to the IGBT section 100.

Discussed in the embodiments is an example of the semiconductor device which includes the n channel type IGBT setting the n type for a first conductivity type, and the p type for a second conductivity type. However, the semiconductor device may include a p channel type IGBT setting reversed conductivity types for the constituent elements.

The invention claimed is:

1. A semiconductor device comprising:
an IGBT section including a vertical IGBT;
a diode section arranged along the IGBT section and including a diode;
a drift layer having a first conductivity type;
a collector region having a second conductivity type and arranged on a rear surface side of the drift layer in the IGBT section;
a cathode region having the first conductivity type and arranged on the rear surface side of the drift layer in the diode section;
a second conductivity type region arranged in a surface layer portion on a front surface side of the drift layer in both the IGBT section and the diode section;
a plurality of trenches arranged in the IGBT section, extending to a depth deeper than the second conductivity type region, and dividing the second conductivity type region into a plurality of parts to provide a channel region constituted by at least a part of the second conductivity type region;

an emitter region having the first conductivity type and arranged in a surface layer portion of the channel region in the IGBT section along a side surface of each trench;

a hole injection reduction layer having the first conductivity type and arranged in an upper layer portion of the drift layer in the diode section, extending to a depth deeper than an anode region constituted by the second conductivity type region in the diode section, having an impurity concentration lower than an impurity concentration of the anode region and higher than an impurity concentration of the drift layer;

a gate insulation film arranged on a surface of each trench;

a gate electrode arranged on a surface of the gate insulation film;

an upper electrode electrically connected with the second conductivity region in the IGBT section, and electrically connected with the anode region; and a lower electrode electrically connected with the collector region in the IGBT section, and electrically connected with the cathode region in the diode section, wherein:

the hole injection reduction layer is further arranged in a portion of the IGBT section adjacent to the diode section;

the semiconductor device further comprises a body region having the second conductivity type, arranged in the channel region, and electrically connecting the channel region with the upper electrode;

an impurity concentration of the body region is equal to or higher than $6\times10^{15}$ cm$^{-3}$;

a total thickness of the drift layer, the collector region, the channel region and the emitter region is defined as a thickness of a semiconductor substrate of T1;

a protrusion amount of the hole injection reduction layer toward the IGBT section from a boundary between the IGBT section and the diode section is defined as L; and a ratio of L/T1 between the thickness of T1 and the protrusion amount of L is equal to or larger than 1.1.

2. The semiconductor device according to claim 1, wherein:

the IGBT section includes a decimated portion that is constituted by one of the plurality of parts of the second conductivity type region divided by the trenches without having the emitter region, which is arranged in a portion of the second conductivity type region other than the channel region.

3. The semiconductor device according to claim 2, wherein:

the decimated portion includes a hole stopper layer having the first conductivity type and dividing the second conductivity type region into an upper region and a lower region in a depth direction of each trench.

4. The semiconductor device according to claim 1, wherein:

the IGBT section includes a decimated portion that is constituted by one of the plurality of parts of the second conductivity type region divided by the trenches without having the emitter region, which is arranged in a portion of the second conductivity type region other than the channel region;

the decimated portion include a hole stopper layer having the first conductivity type and dividing the second conductivity type region into an upper region and a lower region in a depth direction of each trench; and the hole stopper layer is not arranged in a portion of the decimated portion, in which the hole injection reduction layer is arranged, but arranged in a portion of the decimated portion, in which the hole injection reduction layer is not arranged.

5. The semiconductor device according to claim 1, wherein:

the hole injection reduction layer extends to a position shallower than a bottom of each trench.

6. The semiconductor device according to claim 1, wherein:

an impurity concentration of the hole injection reduction layer is in a range between $1\times10^{16}$ cm$^{-3}$ and $1\times10^{17}$ cm$^{-3}$.

7. A semiconductor device comprising:

an IGBT section including a vertical IGBT;

a diode section arranged along the IGBT section and including a diode;

a drift layer having a first conductivity type;

a collector region having a second conductivity type and arranged on a rear surface side of the drift layer in the IGBT section;

a cathode region having the first conductivity type and arranged on the rear surface side of the drift layer in the diode section;

a second conductivity type region arranged in a surface layer portion on a front surface side of the drift layer in both the IGBT section and the diode section;

a plurality of trenches arranged in the IGBT section, extending to a depth deeper than the second conductivity type region, and dividing the second conductivity type region into a plurality of parts to provide a channel region constituted by at least a part of the second conductivity type region;

an emitter region having the first conductivity type and arranged in a surface layer portion of the channel region in the IGBT section along a side surface of each trench;

a hole injection reduction layer having the first conductivity type and arranged in an upper layer portion of the drift layer in the diode section, extending to a depth deeper than an anode region constituted by the second conductivity type region in the diode section, having an impurity concentration lower than an impurity concentration of the anode region and higher than an impurity concentration of the drift layer;

a gate insulation film arranged on a surface of each trench;

a gate electrode arranged on a surface of the gate insulation film;

an upper electrode electrically connected with the second conductivity region in the IGBT section, and electrically connected with the anode region; and a lower electrode electrically connected with the collector region in the IGBT section, and electrically connected with the cathode region in the diode section, wherein:

the hole injection reduction layer is further arranged in a portion of the IGBT section adjacent to the diode section;

the semiconductor device further comprises a body region having the second conductivity type, arranged in the channel region, and electrically connecting the channel region with the upper electrode;

an impurity concentration of the body region is equal to or lower than $6\times10^{15}$ cm$^{-3}$;

a total thickness of the drift layer, the collector region, the channel region and the emitter region is defined as a thickness of a semiconductor substrate of T1;

a protrusion amount of the hole injection reduction layer toward the IGBT section from a boundary between the IGBT section and the diode section is defined as L;

the impurity concentration of the body region is defined as X [$1\times10^{15}$ cm$^{-3}$]; and a ratio of L/T1 between the thickness of T1 and the protrusion amount of L is equal to or larger than $0.1\times X+0.5$.

8. A semiconductor device comprising:

an IGBT section including a vertical IGBT;

a diode section arranged along the IGBT section and including a diode;

a drift layer having a first conductivity type;

a collector region having a second conductivity type and arranged on a rear surface side of the drift layer in the IGBT section;

a cathode region having the first conductivity type and arranged on the rear surface side of the drift layer in the diode section;

a second conductivity type region arranged in a surface layer portion on a front surface side of the drift layer in both the IGBT section and the diode section;

a plurality of trenches arranged in the IGBT section, extending to a depth deeper than the second conductivity type region, and dividing the second conductivity type region into a plurality of parts to provide a channel region constituted by at least a part of the second conductivity type region;

an emitter region having the first conductivity type and arranged in a surface layer portion of the channel region in the IGBT section along a side surface of each trench;

a hole injection reduction layer having the first conductivity type and arranged in an upper layer portion of the drift layer in the diode section, extending to a depth deeper than an anode region constituted by the second conductivity type region in the diode section, having an impurity concentration lower than an impurity concentration of the anode region and higher than an impurity concentration of the drift layer;

a gate insulation film arranged on a surface of each trench;

a gate electrode arranged on a surface of the gate insulation film;

an upper electrode electrically connected with the second conductivity region in the IGBT section, and electrically connected with the anode region; and a lower electrode electrically connected with the collector region in the IGBT section, and electrically connected with the cathode region in the diode section, wherein:

the hole injection reduction layer is further arranged in a portion of the IGBT section adjacent to the diode section;

the semiconductor device further comprises a body region having the second conductivity type, arranged in the channel region, and electrically connecting the channel region with the upper electrode, wherein:

an impurity concentration of the body region is equal to or higher than $3\times10^{15}$ cm$^{-3}$;

a total thickness of the drift layer, the collector region, the channel region and the emitter region is defined as a thickness of a semiconductor substrate of T1;

a protrusion amount of the hole injection reduction layer toward the IGBT section from a boundary between the IGBT section and the diode section is defined as L; and a ratio of L/T1 between the thickness of T1 and the protrusion amount of L is equal to or larger than 0.8.

9. The semiconductor device according to claim 8, wherein:

the plate thickness defined as T1 is 75 μm; and the protrusion amount defined as L is equal to or larger than 60 μm.

* * * * *